United States Patent
Sulzbach et al.

(10) Patent No.: US 10,381,129 B2
(45) Date of Patent: Aug. 13, 2019

(54) EPOXY RESIN COMPOSITIONS COMPRISING EPOXY AND VINYL ESTER GROUPS

(75) Inventors: Horst Sulzbach, Raesfeld (DE); Meiyong Zhou, Guangdong (CN); Wan Li Chen, Guangdong (CN)

(73) Assignee: ELANTAS GMBH, Wesel (DE)

( * ) Notice: Subject to any disclaimer, the term of this patent is extended or adjusted under 35 U.S.C. 154(b) by 339 days.

(21) Appl. No.: 13/995,969

(22) PCT Filed: Dec. 12, 2011

(86) PCT No.: PCT/EP2011/072435
§ 371 (c)(1),
(2), (4) Date: Sep. 27, 2013

(87) PCT Pub. No.: WO2012/084569
PCT Pub. Date: Jun. 28, 2012

(65) Prior Publication Data
US 2014/0018472 A1 Jan. 16, 2014

(30) Foreign Application Priority Data
Dec. 21, 2010 (DE) .................. 10 2010 063 808

(51) Int. Cl.
*H01B 3/40* (2006.01)
*C08L 63/10* (2006.01)
*C08G 59/17* (2006.01)
*H05K 3/28* (2006.01)

(52) U.S. Cl.
CPC ........... *H01B 3/40* (2013.01); *C08G 59/1466* (2013.01); *C08L 63/10* (2013.01); *H05K 3/285* (2013.01)

(58) Field of Classification Search
CPC ....................................................... H01B 3/40
See application file for complete search history.

(56) References Cited

U.S. PATENT DOCUMENTS

| | | | | |
|---|---|---|---|---|
| 3,395,121 | A | * 7/1968 | Pfann | C08G 59/306 528/121 |
| 4,124,760 | A | * 11/1978 | Green | C08G 59/26 528/117 |
| 5,439,956 | A | 8/1995 | Noguchi | |
| 2007/0027298 | A1 * | 2/2007 | Minegishi | C08G 59/4292 528/408 |
| 2011/0223539 | A1 * | 9/2011 | Kurafuchi | G03F 7/0388 430/280.1 |

FOREIGN PATENT DOCUMENTS

| | | | | |
|---|---|---|---|---|
| EP | 0193643 A2 | * 9/1986 | ........ | C08F 299/026 |
| EP | 207188 A | * 1/1987 | | |
| EP | 0207188 A2 | * 1/1987 | ........ | B23K 35/224 |
| EP | 0207188 A2 | 1/1987 | | |
| EP | 0346486 A1 | 12/1989 | | |
| EP | 0844809 A2 | 5/1998 | | |
| JP | 08292567 A | * 11/1996 | | |
| JP | 09291126 A | * 11/1997 | | |

OTHER PUBLICATIONS

International Search Report issued in PCT/EP2011/072435, dated Mar. 1, 2012.
International Preliminary Report on Patentability for International Application No. PCT/EP2011/072435 dated Jun. 27, 2013.

* cited by examiner

*Primary Examiner* — Randy P Gulakowski
*Assistant Examiner* — Ha S Nguyen
(74) *Attorney, Agent, or Firm* — Birch, Stewart, Kolasch & Birch LLP

(57) ABSTRACT

Epoxy resin composition comprising
a) the reaction product formed from
  a1) one or more epoxy compounds having at least two epoxy groups, and
  a2) 0.2 to 0.9 mol of acrylic acid or methacrylic acid or mixtures thereof per mole of epoxy groups, as component A;
b) a solvent comprising vinyl groups as component B.

4 Claims, No Drawings

EPOXY RESIN COMPOSITIONS COMPRISING EPOXY AND VINYL ESTER GROUPS

The invention relates to epoxy resin compositions comprising epoxy and vinyl ester groups, to coating compositions comprising them, and to the use thereof for insulation of electric and electronic components and devices.

Liquid standard compositions currently being used for electrical insulation are those based on unsaturated polyesters (UP) or epoxy resins (EP).

UP systems which are used as impregnating resins comprise a reactive diluent, for example styrene, and thus cause correspondingly high monomer emissions during hardening, or they are monomer-free with the associated higher viscosity. The free-radical polymerization is typically initiated using a thermal free-radical initiator or by irradiation with UV light.

The epoxy resin systems being used are hardened with heating. The hardener components used are either acidic anhydrides or else, in the case of catalytic hardening, Lewis acids, for example $BCl_3$-amine complexes.

A relatively extensive description of polymers used as impregnating resins can be found in Horst Sulzbach (editor), "Polymers for Electrical Insulation", Verlag Moderne Industrie 2008, ISBN 978-3-937889-82-5 and the further citations therein.

Epoxy vinyl esters have many of the advantageous properties of epoxy resin systems, such as good processability and chemical resistance, and can additionally be diluted in acrylic solvents with very low VOC contents (VOC=volatile organic compounds). U.S. Pat. No. 5,984,647 describes the use of such systems for the impregnation of a hermetic motor. However, the adhesive strengths of these systems do not reach the values which are possible in principle with epoxy resin systems.

The UV hardening properties of epoxy resin compositions with only partly converted epoxy groups are described by Saiki et al. in Journal of Applied Polymer Science 117 (2010) 3466-3472 and by Park et al. in International Journal of Adhesives & Adhesives 29 (2009) 710-717. U.S. Pat. No. 4,888,269 describes such resins comprising epoxy groups and acrylate groups in conjunction with polyfunctional vinyl group-containing reactive diluents with more than two vinyl groups, the systems described therein being cured with amines and used as solder resist inks.

It is an object of the invention to provide an impregnating resin system which combines the good adhesion properties and the long-term stability of epoxy resin systems with the good elasticity of systems comprising acrylate groups, is of low viscosity and comprises only small amounts of VOC.

The object is achieved by an epoxy resin composition comprising
  a) the reaction product formed from
    a1) one or more epoxy compounds having at least two epoxy groups, and
    a2) 0.2 to 0.9 mol of acrylic acid or methacrylic acid or mixtures thereof per mole of epoxy groups,
    as component A;
  b) a solvent comprising vinyl groups as component B.

It has been found that, surprisingly, an epoxy resin system in which the oxirane groups have been converted only partially to vinyl ester groups exhibits an adhesive strength comparable to that of the epoxy resins, and can be blended without any problem with reactive diluents possessing a vinyl group and an ester functionality.

The inventive epoxy-vinyl ester hybrid systems (EVHS) can be hardened with heating, the vinyl ester groups being polymerized by means of a free-radical initiator and the epoxy groups being crosslinked by means of a heat-activated Lewis acid or of an acid anhydride.

For instance, the invention provides resin systems for electrical insulation with outstanding thermal stability, adhesion and electrical insulation properties in the hardened state. The resin can be used, alone or in combination with fixed insulation materials (tapes etc.), to insulate electrical devices such as motors, transformers and generators.

The object is also achieved by coating compositions comprising 100 parts by weight of the epoxy resin composition,
  ii) 0.1 to 10 parts by weight of a free radical-forming polymerization initiator,
  iii) 0.1 to 5 parts by weight of a hardener.

The inventive epoxy resin compositions comprise a partial reaction product of one or more epoxy-functional compounds having two or more epoxy groups with acrylic acid or methacrylic acid, wherein not all epoxy groups are converted and thus oxirane rings still remain in the molecule. This partial reaction product is diluted with a reactive diluent comprising vinyl groups.

Suitable epoxy-functional compounds having at least two epoxy groups are the diglycidyl esters of bisphenol A and bisphenol F, preference being given to the diglycidyl ester of bisphenol A. Suitable epoxy-functional compounds having at least two epoxy groups are also epoxy compounds based on phenol novolac or cresol novolac. These are obtained by reaction of phenol-formaldehyde resins or cresol-formaldehyde resins with epichlorohydrin or methylepichlorohydrin as the glycidyl ether or methylglycidyl ether. Suitable phenol novolac (methyl)glycidyl ethers and cresol novolac (methyl)glycidyl ethers generally have a melting point in the range from 60 to 120° C., preferably from 70 to 100° C., and have an average of 2 to 20 and preferably 3 to 10 epoxy groups per molecule.

The epoxy-functional compounds are reacted in the presence of an esterification catalyst with acrylic acid or methacrylic acid at temperatures of generally 60 to 140° C., preferably 80 to 120° C. Suitable esterification catalysts are tertiary amines such as triethylamine or diazabicyclooctane, or quaternary ammonium salts, for example tetramethylammonium chloride.

Preference is given to a reaction product formed from
  a1) one or more epoxy compounds having at least two epoxy groups, and
  a2) 0.3 to 0.7 mol and more preferably 0.35 to 0.65 mol of acrylic acid or methacrylic acid or mixtures thereof per mole of epoxy groups.

Suitable solvents comprising vinyl groups—also referred to as reactive diluents—are monofunctional, difunctional and polyfunctional reactive diluents having generally 1 to 6 vinyl groups. Preference is given to the acrylates and methacrylates of diols and polyols having generally 2 to 6 OH groups. Particular preference is given to the acrylates and methacrylates of diols, for example butanediol di(meth)acrylate, hexanediol di(meth)acrylate, diethylene glycol di(meth)acrylate, triethylene glycol di(meth)acrylate, dipropylene glycol di(meth)acrylate, tripropylene glycol di(meth)acrylate, and also further di(meth)acrylates prepared on the industrial scale.

Suitable polyfunctional reactive diluents having 3 to 6 vinyl groups are, for example, (meth)acrylic esters of trimethylolpropane, pentaerythritol or dipentaerythritol, or the allyl alcohol esters of trimellitic or pyromellitic acid.

Tri- or polyfunctional reactive diluents can also be used together with difunctional reactive diluents to increase the crosslinking density.

In addition, reactive diluents having only one vinyl group can also be used. Examples are butyl (meth)acrylate, hexyl (meth)acrylate and octyl (meth)acrylate.

The inventive epoxy resin compositions or coating compositions preferably comprise—based on the sum of all reactive diluents—at least 90% by weight, more preferably at least 95% by weight and especially exclusively difunctional reactive diluents, i.e. those having two vinyl groups, for example butanediol di(meth)acrylate.

In general, the inventive epoxy resin compositions comprise 40% to 70% by weight and preferably 45 to 65% by weight of reaction product formed from epoxy compound and (meth)acrylic acid (component A), and 23 to 58% by weight and preferably 30 to 48% by weight of solvent comprising vinyl groups (reactive diluent, component B), the sum of components A and B adding up to 100% by weight.

The epoxy resin compositions are hardened by what is called a dual mechanism, wherein the epoxy groups are firstly hardened by means of a catalyst, for example a Lewis acid, or by means of an anhydride, and the double bonds of the (meth)acryloyl groups are secondly crosslinked by means of a polymerization initiator which is activable by heat or UV light and forms free radicals.

Suitable polymerization initiators ii) which form free radicals are the polymerization initiators known to those skilled in the art. Preferred polymerization initiators activable by means of UV light are 4,4'-dimethylbenzyl ketal, 4,4'-dimethoxybenzoin, benzoin methyl ether and 2,4,6-trimethylbenzoyldiphenylphosphine oxide.

Preferred heat-activable polymerization initiators are dicumyl peroxide, di-tert-butyl peroxide and tert-butyl perbenzoate.

Suitable Lewis acids are complexes of $BF_3$ or $BCl_3$ with tertiary amines, generally tri-$C_1$-$C_{10}$-alkylamines, for example $BCl_3$-dimethyloctylamine, $BF_3$-trimethylamine and $BF_3$-tributylamine.

Suitable anhydrides are tetrahydrophthalic anhydride, methyltetrahydrophthalic anhydride, hexahydrophthalic anhydride and dodecylsuccinic anhydride.

A preferred anhydride is hexahydrophthalic anhydride.

In a particularly preferred embodiment of the invention, the hardeners used are Lewis acids.

The invention also relates to the use of the epoxy resin compositions and of the coating compositions for insulation of electric and electronic components and devices. The invention relates more particularly to the use of the compositions and coating compositions for insulation of electric and electronic components and devices which are in contact with liquid or vaporous organic chemicals or solvents, for example cooling fluids. Examples are electric motors used in cooling units, which are in contact with an atmosphere of vaporous cooling fluid or with the cooling fluid itself. Examples of such cooling fluids are Frigens named Frigen 22 and Frigen 410. Such components or devices must be hermetically shielded from their environment, which is why reference is also made to "hermetic applications".

The invention is illustrated in detail by the examples which follow.

EXAMPLES

Example 1

A three-neck flask with thermometer, stirrer and reflux condenser is charged with 633.6 g of bisphenol A epoxy resin (trade name E44, epoxide equivalent of 227.27 g/mol, corresponding to 2.788 epoxy groups), 100.45 g of acrylic acid (corresponding to 1.394 carboxyl groups), 0.528 g of hydroquinone and 0.6336 g of tetramethylammonium chloride. The mixture is heated to 105° C. After 3 hours, the mixture has an acid number of 1.0 mg KOH/g.

The procedure is as in Example 1, except with the amounts of the individual components specified in Table 1.

TABLE 1

|  | Examples | |
|---|---|---|
|  | 2 | 3 |
| Epoxy resin E-44 | 633.6 g | 633.6 g |
| Acrylic acid | 85 g | 115 g |
| Tetramethylammonium chloride | 0.5 g | 0.8 g |
| Hydroquinone | 0.4 g | 0.7 g |
| Acid number | 0.2 mg KOH/g | 1.5 mg KOH/g |
| Resin name | A-2 | A-3 |

Example 4

620.26 g of a cresol novolac of the "F-51" type (epoxide equivalent of 196.08 g/mol, corresponding to an average of 3.162 epoxy groups per molecule) are heated to 65° C. 0.4 g of hydroquinone, 94.91 g of acrylic acid (corresponding to 1.317 carboxyl groups per molecule of the epoxy compound) and 0.738 g of tetramethylammonium chloride are added, and the mixture is left to react under air at 105° C. When the acid number declines below 1 mg KOH/g, the reaction is stopped by cooling. The resin obtained is named A-4.

Examples 5 and 6

Resins A-5 and A-6 are, as described in Example 4, produced with the amounts of the individual components listed in Table 2.

TABLE 2

|  | Examples | |
|---|---|---|
|  | 5 | 6 |
| Cresol novolac F-51 | 620.26 g | 620.26 g |
| Acrylic acid | 80 g | 115 g |
| Tetramethylammonium chloride | 0.5 g | 0.9 g |
| Hydroquinone | 0.3 g | 0.5 g |
| Acid number | 0.15 mg KOH/g | 1.14 mg KOH/g |
| Resin name | A-5 | A-6 |

Examples 7 to 11

By mixing resins A-1 to A-6 with butanediol dimethacrylate, dicumyl peroxide and boron trichloride-dimethyloctylamine complex, fully formulated impregnating resin coating compositions for electrical insulation were produced. The compositions and properties thereof are reproduced in Table 3.

TABLE 3

| | Examples | | | | |
|---|---|---|---|---|---|
| | 7 | 8 | 9 | 10 | 11 |
| A-1 | | | 35 g | | |
| A-2 | 65 g | | | 40 g | |
| A-3 | | | | | 43 g |
| A-4 | | | 25 g | | |
| A-5 | | 60 g | | 19 g | |
| A-6 | | | | | 16 g |
| Butanediol dimethacrylate | 35 g | 40 g | 40 g | 41 g | 38 g |
| Dicumyl peroxide | 1 g | 1 g | 1 g | 1 g | 1 g |
| BCl$_3$-dimethyloctylamine | 2 g | 2 g | 2 g | 2 g | 2 g |
| Properties | | | | | |
| Viscosity (mPa · s, 23° C.) | 320 | 525 | 500 | 427 | 395 |
| Gel time in min, 8 g@120° C. | 5.51 | 4.82 | 4.96 | 5.10 | 5.28 |
| Baking resistance, at 23° C. in N | 243 | 334 | 296 | 283 | 262 |
| Shore D hardness | 68 | 102 | 95 | 84 | 75 |

The gel time is determined to DIN 16945, and the baking resistance to IEC 61033.

For the use of windings impregnated with impregnating resin in hermetic motors, for example in refrigerators, what is called an oil test must be passed. This is conducted as follows:

Helical coils made from MW 35 enamelled wire are produced as described in ASTM D 2519. The helical coils are immersed into the impregnating bath and hardened at 150° C. for 3 hours. A Parr bomb is filled with 500 ml of mineral oil. Five helical coils are introduced into the oil. The bomb is closed. Thereafter, it is filled with approx. 0.5 kg of Frigen R 22 (or 410) via a valve. The bomb is stored at 120° C. for 168 hours. After cooling and decompression, the helical coils are removed and dried with paper. Baking resistance is tested and compared with that before the oil test. A 10% decline is still tolerable.

The baking resistances to ASTM2519-2 in N are reproduced in Table 4.

TABLE 4

| | Examples | | | | |
|---|---|---|---|---|---|
| | 7 | 8 | 9 | 10 | 11 |
| Before the oil test | 243.10 | 334.52 | 296.78 | 283.09 | 262.40 |
| After the oil test | 221.73 | 326.11 | 290.04 | 277.45 | 238.52 |

Comparative Example 1

An impregnating resin which does not contain any free oxirane groups and is as described in Example 1 of U.S. Pat. No. 5,984,647 is produced and tested as described above.

The results in comparison with the results of Example 11 are reproduced in Table 5.

The breakdown resistance (breakdown voltage) was determined to IEC 60464 part 2, and the extraction values by weighing the helical coils before and after the oil test.

TABLE 5

| | Impregnating resin | |
|---|---|---|
| | Example 11 | Comparative example 1 |
| Breakdown voltage (V/my) | 1.59 | 1.32 |
| R22 extraction (%) | 0.21 | 0.37 |
| R 410 extraction (%) | 0.18 | 0.21 |
| Baking resistance (N) before the oil test | 262 | 117 |
| Baking resistance (N) after the oil test | 238 | 113 |

The inventive impregnating resin according to Example 11 has lower extraction values than, and twice the baking resistance of, the impregnating resin according to Comparative example 1.

The invention claimed is:

1. A coating composition, consisting of:
   i) 100 parts by weight of an epoxy resin comprising
      a) the reaction product formed from
         a1) one or more epoxy compounds having at least two epoxy groups being selected from bisphenol A diglycidyl ether, a phenol novolac glycidyl ether, and a cresol novolac glycidyl ether, and
         a2) 0.3 to 0.7 mol of acrylic acid or methacrylic acid or mixtures thereof per mole of epoxy groups,
      as component A;
   b) a solvent comprising vinyl groups as component B selected from the group consisting of butanediol di(meth)acrylate, hexanediol di(meth)acrylate, dipropylene glycol di(meth)acrylate and tripropylene glycol di(meth)acrylate;
   the solvent comprising vinyl groups of component B consisting to an extent of at least 90% by weight of solvents comprising difunctional vinyl groups, based on the sum of all solvents comprising vinyl groups,
   ii) 0.1 to 10 parts by weight of a free radical-forming polymerization initiator,
   iii) 0.1 to 5 parts by weight of a hardener, which is a Lewis acid selected from complexes of BF$_3$ and BCl$_3$ with tertiary amines, and
   iv) optionally a polymerization inhibitor.

2. A method of insulating electric and/or electronic components and devices, comprising the step of impregnating the electric or electronic components and devices with the coating composition according to claim 1.

3. A method for insulating electric motors used in cooling units, comprising: impregnating the electric motors with the coating composition according to claim 1 to hermetically shield them from their environment.

4. The coating composition of claim 1, wherein the free radical-forming polymerization initiator is selected from the group consisting of 4,4'-dimethylbenzyl ketal, 4,4'-dimethoxybenzoin, benzoin methyl ether, 2,4,6-trimethylbenzoyldiphenylphosphine oxide, dicumyl peroxide, di-tert-butyl peroxide, and tert-butyl perbenzoate.

* * * * *